March 29, 1955 G. W. WALLIN 2,705,288

TUNER

Filed Jan. 25, 1951

INVENTOR.

Gus W. Wallin,

BY

Foorman L. Mueller

Atty.

United States Patent Office 2,705,288

Patented Mar. 29, 1955

2,705,288

TUNER

Gus W. Wallin, Chicago, Ill., assignor to Motorola, Inc., Chicago, Ill., a corporation of Illinois Application January 25, 1951, Serial No. 207,801

2 Claims. (Cl. 250—40)

This invention relates generally to electrical resonant circuit tuning devices and more particularly to a tuner which operates over a wide range of frequencies in the ultra-high frequency band.

The increased use of radio waves for providing communications of various types including radar and television has made it necessary to use higher frequencies than previously have been used. Most prior operations in the ultra high frequency band have been at a fixed frequency, and it has therefore not been necessary to provide tuning units which are operable over a range of frequencies.

A large number of channels in the ultra high frequency band have now been assigned for television use and it is therefore desirable to provide a tuner which will operate in this band and which will select any channel desired. The tuners which have been proposed for this use have been of a relatively complicated nature and thereby have been quite expensive in construction. This has been caused in a large measure because of the fact that the values of inductance and capacitance required are quite small and the components are therefore critical. Another problem has been to provide the wide range of frequencies required. The use of switching means to provide a wide range is objectionable since any available switching means introduces capacity and/or inductance into the circuit which is substantial as compared to the values of the components of the tuner.

It is therefore an object of the present invention to provide an improved tuning unit for use over a wide range of frequencies in the ultra high frequency band and which is of simple and inexpensive construction.

A further object of this invention is to provide a tuning unit which provides satisfactory operation over a very wide frequency range without the use of switching means to condition the unit for operation in different frequency regions.

A still further object of this invention is to provide a tuning unit for use in the ultra high frequency band in which the components are of simple and inexpensive construction and may be made to ordinary production tolerances while still providing the desired characteristics.

A feature of this invention is the provision of a tuning unit including a cylindrical conductor and a helical coil with a pair of electrically interconnected conducting portions individually movable in the cylindrical conductor and the helical coil so that a first condenser is formed between the cylindrical conductor and one conducting portion and a second condenser is formed between the coil and the other conducting portion, with the condensers and a portion of the coil being connected in series. The conducting portions are movable to change the characteristics of the condensers and to change the effective position at which the condenser is connected to the coil so that the portion of the coil in the series circuit may be varied.

Another feature of this invention is the provision of an insulating form having conducting material thereon forming a cylindrical conductor and a coil, and a core movable within the form having interconnected portions movable with respect to the cylindrical conductor and the coil, whereby movement of the core simultaneously causes variation in the capacity and inductance of the unit in the same sense.

A further feature of this invention is the provision of a tuning unit including a tubular insulating member having conducting material positioned on the outside surface thereof to form a cylindrical conductor and a helical coil spaced therefrom, and an elongated core member slidably positioned within the tubular member including enlarged portions cooperating with the cylindrical conductor and the coil. The enlarged portions are electrically interconnected and terminals are provided at the adjacent ends of the cylindrical conductor and the coil to provide a series circuit between the terminals which includes the capacity between the cylindrical conductor and the core portion therein, the capacity between the coil and the core portion therein, and at least a part of the inductance of the coil.

Other objects and features, and the attending advantages of the invention will be apparent from a consideration of the following description when taken in connection with the accompanying drawings in which.

Figures 1, 2, 3, 4, 5, 6:
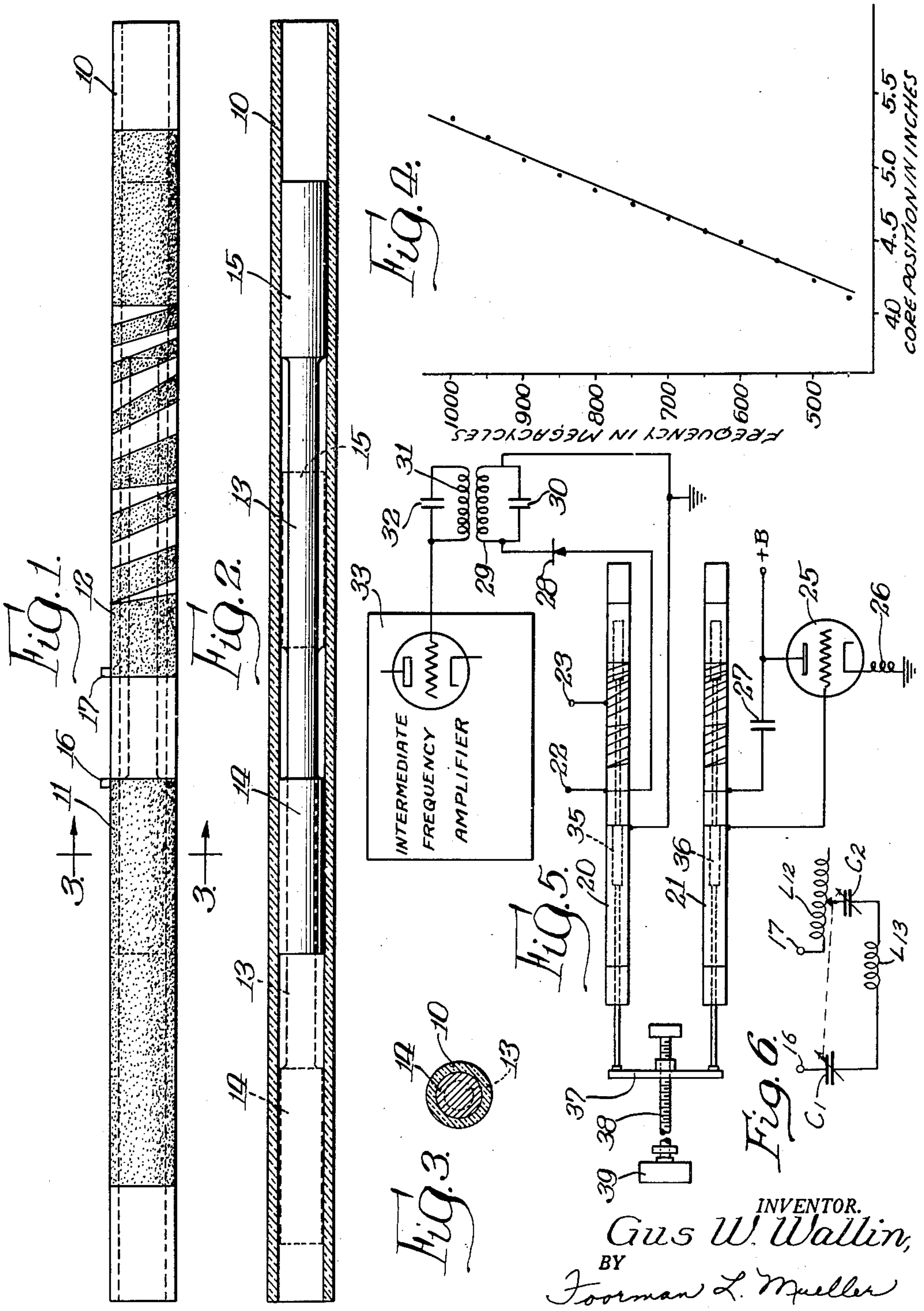
Fig. 1 is a plan view of a tuner constructed in accordance with the invention.
Fig. 2 is a cross sectional view of the unit of Fig. 1 illustrating the core thereof.
Fig. 3 is a cross sectional view along the lines 3—3 of Fig. 1.
Fig. 4 is a curve showing the characteristics of the tuning unit.
Fig. 5 illustrates the application of the tuning unit in a receiver circuit.
Fig. 6 illustrates the approximate equivalent electrical circuit of a tuning unit in accordance with the invention.

In practicing the invention there is provided a tuning unit for use in a television receiver operating in the ultra high frequency band, covering the frequency range of from about 400 to about 1000 megacycles. The tuning unit includes an insulating tubular member which may be glass having conducting material on the outside surface thereof. The conducting material is provided in such configuration to form a conducting cylinder at one end of the tubular member and a helical coil at the other end of the tubular member and spaced from the conducting cylinder. Within the tubular member is a conducting core having enlarged portions at the ends thereof. One end of the core is within the conducting cylinder and forms a first condenser therewith. The core and the cylinder also have inductance so that these elements together form resonant means having generally the same characteristics as a coaxial transmission line. The other end of the core is within the coil so that a second condenser is formed between the core and the coil. Terminals are provided for making connections to the tuning unit with the terminals being connected to adjacent points on the cylindrical conductor and the coil. As the core is made of conducting material, a continuous series circuit is provided between the terminals including the first and second condensers, a portion of the coil, and the inductance of the core and cylinder. Movement of the core within the insulating tubular member varies the capacity and inductance of the tuning unit in the same sense to thereby vary the resonant frequency of the unit. More specifically, movement of the core changes the capacity of the first and second condensers, and also varies the portion of the coil connected in the series circuit. Such a tuning unit may be constructed to tune the radio frequency circuits and/or oscillator circuit of a television receiver operating in the ultra high frequency band.

Referring now to Figs. 1, 2 and 3 of the drawings, the tuning unit includes a tubular insulating member 10 which may be made of glass or other suitable insulating material. Figs. 1, 2 and 3 show the unit enlarged as compared to the size found suitable for tuning a television receiver in the ultra high frequency range from 400 to 1000 megacycles. On the outside surface of the tubular glass member there is provided a first coating 11 which forms a conducting cylinder. Spaced from the conducting cylinder 11 is a second coating 12 which forms a helical coil with conducting cylinders at the ends thereof. The coil has substantial inductance at the frequencies involved. The conducting coatings may be provided in various manners such as by foil secured to the outside surface of the cylinder or by depositing material directly on the surface of the tubular insulating member.

Within the tubular insulating member 10 there is provided a core 13 having enlarged portions 14 and 15 on the ends thereof. The core is movable within the tubular insulating member from one limiting position which is shown in solid lines to a second limiting position which is shown in dotted lines. The enlarged portion 14 is therefore positioned within the conducting cylinder 11 and forms with the conducting cylinder 11 a first variable condenser having different characteristics depending upon the position of the portion 14 with respect to the cylinder 11. The conducting cylinder 11 and the core portion 14 also have inductance so that these elements together form resonant means having generally the characteristics of coaxial transmission lines. The enlarged portion 15 is movable within the coil 12 and this portion of the unit also has different characteristics depending upon the position of the core. First, the capacity between the portion 15 and the coil 12 varies with the position of the core and second, the effective point at which the capacity is coupled to the coil changes with the position of the portion 15. The core portion 15 and the coil 12 thereabout also form to some extent, a transmission line.

Terminals 16 and 17 are provided on the cylinder 11 and coil 12 respectively for making connections to the tuning unit. A continuous series circuit is provided from terminal 16 through the first condenser formed by conducting cylinder 11 and the core portion 14, through the core to the enlarged portion 15, then through the second condenser formed between the enlarged portion 15 and the coil 12, and through the coil 12 back to the terminal 17. The series resonant circuit is therefore completed through the conducting core 13. It is therefore apparent that the value of the inductance in this circuit depends upon the position of the core since when the enlarged portion 15 is in the dotted position shown at the left only a very small part of the coil 12 is in the series circuit and the inductance is therefore small, and when the portion 15 is at the right as shown in solid lines the entire coil is in the series circuit and the inductance is greater. The core 13 is preferably made of non-magnetic material so that the inductance of the unit is small as is required for the frequency range mentioned. The capacity of the unit is also greatest when the core is to the right as the portion 14 is entirely within the conducting cylinder 11 and the portion 15 is largely within the cylindrical conducting portion at the end of the coil 12.

In Fig. 6 the approximate equivalent electrical circuit of a tuning unit in accordance with the invention is illustrated. The first condenser formed between the conducting cylinder 11 and the core portion 14 is indicated by the variable condenser $C_1$. The second condenser formed between the core portion 12 and the enlarged core portion 15 is designated $C_2$. The coil 12 is indicated by inductance $L_{12}$, and the inductance of the core 13 is indicated by the inductance $L_{13}$. The condensers $C_1$ and $C_2$ will both vary with the position of the core and the portion of the inductance $L_{12}$ effectively connected in the circuit will change. The other portions of the tuning unit also have inductances which may change, but these are minor and the elements shown on the simplified circuit diagram of Fig. 6 indicate generally the principal effective electrical equivalents.

Fig. 4 illustrates the resonant frequency of the tuning unit for various positions of the core within the insulating form. It is apparent from this curve that the frequency variation is substantially linear with core movement. This makes tuning of the unit very easy and simplifies the problem of providing tracking of a plurality of tuning units in a superheterodyne receiver or the like. The frequency vs. position characteristics of the unit depends upon the configuration of the conducting coatings on the insulating member. By properly shaping the coatings various changes in the frequency vs. position characteristics can be provided as may be desired in a particular application. Units have been constructed for operation in the frequency range from 400 to 1000 megacycles in which this range in frequency is provided by a core movement of one and a quarter inches. This amount of movement has been found to be completely satisfactory in tuners of various sorts and permits the ganging of such a tuning unit with tuning units for operation in other frequency ranges if this is desired.

In Fig. 5 there is illustrated the use of two tuning units in accordance with the invention in an ultra high frequency television receiver circuit of the superheterodyne type. In this circuit two tuning units designated 20 and 21 are provided. The tuning unit 20 is provided in the antenna circuit with the antenna being connected to terminals 22 and 23. These terminals are provided to include only a portion of the coil of the tuning unit to thereby provide the proper impedance for matching the antenna from which the signals are derived. The tuning unit 21 is used in the oscillator circuit which includes a triode tube 25 having the cathode thereof connected through inductor 26 to ground, the grid connected to the conducting cylinder of the tuning unit and the plate connected through condenser 27 to the coil portion of the tuning unit. The plate of the tube is also connected to plus B for providing energizing potential. The tuning unit 20 is connected in a circuit including crystal detector 28 and the tuned circuit including coil 29 and condenser 30. The crystal 28 provides first detector action for mixing the incoming signal from the antenna which is selected by the tuning unit 20 with the oscillator frequency which is controlled by the tuning unit 21. No physical connection is generally required between the oscillator and the antenna circuit since the oscillator frequency will be injected into the antenna circuit by stray couplings. The coil 29 is inductively coupled to coil 31 which is tuned by condenser 32, with these tuned circuits selecting the intermediate frequency used in the receiver. This signal may be applied to an intermediate frequency amplifier 33, being specifically applied to the grid of the first stage of such an amplifier.

The cores 35 and 36 of the tuning units 20 and 21 respectively may be connected to a carriage 37 having a portion threaded to shaft 38. Rotation of the shaft 38 by the knob 39 therefore causes simultaneous movement of the cores 35 and 36. By properly designing the coatings of the tuning units, corresponding variations in frequency can be provided in the antenna and oscillator circuits to provide a fixed intermediate frequency. As previously stated, the units can be constructed to have linear frequency characteristics to thereby simplify the tracking problem.

It is apparent from the foregoing that a tuning unit is hereby provided which takes a very simple and inexpensive form. It has been found that the various dimensions required for providing operation in the desired frequency range are not unduly critical and that standard manufacturing tolerances are satisfactory. The tubular glass member is obviously an inexpensive item and the conducting coating can be provided thereon in very inexpensive ways. Further, the core member is a simple part which can be very easily and inexpensively produced. The unit can be constructed so that the characteristics thereof are such to provide linear frequency change with change in the position of the core. As previously stated, this depends upon the configuration of the conducting coatings, and methods for providing such coatings in the required accuracy are well known and can be easily provided.

The tuning unit in accordance with the invention provides a very wide range of frequency variation without the use of any moving part which introduces undesired inductance or capacity into the circuit. The unit is of small size and can therefore be easily incorporated onto a receiver chassis. As previously stated, the amount of movement of the coil required for providing a very wide range of frequencies can be limited to a practical value so that the unit is easily tuned and can be ganged with other tuning units in a combination receiver if this is desirable.

Although there has been described one embodiment of the invention which is illustrative thereof, it is obvious that various changes and modifications can be made therein without departing from the intended scope of the invention as defined in the appended claims.

I claim:

1. An ultra high frequency tuning unit for a television receiver and the like including in combination, a tubular conductor, a helical conductor spaced axially from said tubular conductor along a common axis therewith and forming an inductance coil insulated from said tubular conductor, and an elongated core of electrically conductive material mounted for movement along said common axis within said tubular conductor and said helical conductor, said core having a first portion movable within said tubular conductor in relatively high capacitive relation therewith, said core having a second portion movable within said helical conductor in relatively high capacitive relation therewith, said core having a third portion interposed on said common axis between said first and second portions and electrically and mechanically interconnecting said first and second portions, said third portion having a reduced cross section with respect to said first and second portions so as to have a relatively low capacitive relation with said tubular and helical conductors, said third portion having a length at least as great as the spacing between said tubular conductor and said helical conductor, so that a series resonant circuit is formed between the adjacent ends of said tubular and helical conductors extending through said reduced third portion of said core, said resonant circuit having capacity and inductance variations in the same sense upon movement of said core to thereby provide a wide range of variations of the frequency of said resonant circuit.

2. An ultra high frequency tuning unit for a television receiver and the like including in combination, a tubular insulating member, a tubular conductive layer disposed on the outer surface of said tubular insulating member and forming a cylindrical conductor, a helical conductive layer disposed on the outer surface of said tubular insulating member axially spaced from said cylindrical conductor and forming an inductance coil insulated from said cylindrical conductor, first and second terminals in respective electrical contact with the adjacent ends of said cylindrical conductor and said inductance coil, an elongated electrically conductive core slidably mounted within said tubular insulating member and having a sliding fit therein, said elongated core having a first end portion in relatively high capacitive relation with said cylindrical conductor, said first end portion being adapted to move in and out of said cylindrical conductor to vary the capacity therebetween, said elongated core having a central portion of reduced diameter as compared with said first end portion and in relatively low capacitive relation with said cylindrical conductor and said inductance coil, said central portion having a length at least as great as the spacing between said tubular conductive layer and said helical conductive layer, and said elongated core having a second end portion in relatively high capacitive relation with said inductance coil with a diameter corresponding to that of said first end portion, said second end portion being adapted to be moved across said inductance coil to control the effective turns of said coil in circuit between said second terminal and said core, whereby a series-resonant circuit is formed between said first and second terminals having capacity and inductance variations in the same sense upon movement of said core.

References Cited in the file of this patent

UNITED STATES PATENTS

| | | |
|---|---|---|
| 2,250,366 | Frisbee | July 22, 1941 |
| 2,394,391 | Martowicz | Feb. 5, 1946 |
| 2,470,425 | Bell | May 17, 1949 |
| 2,502,202 | Burroughs | Mar. 28, 1950 |
| 2,516,287 | Aske | July 25, 1950 |
| 2,562,263 | Ehrlich | July 31, 1951 |
| 2,663,799 | Bell | Dec. 22, 1953 |